US011569792B2

(12) United States Patent
Luu et al.

(10) Patent No.: US 11,569,792 B2
(45) Date of Patent: Jan. 31, 2023

(54) INTEGRATED INVERTER OUTPUT PASSIVE FILTERS FOR ELIMINATING BOTH COMMON MODE AND DIFFERENTIAL MODE HARMONICS IN PULSE-WIDTH MODULATION MOTOR DRIVES AND METHODS OF MANUFACTURE AND USE THEREOF

(71) Applicant: MTE Corporation, Menomonee Falls, WI (US)

(72) Inventors: Tin Luu, Muskego, WI (US); Todd Shudarek, West Bend, WI (US)

(73) Assignee: MTE Corporation, Menomonee Falls, WI (US)

( * ) Notice: Subject to any disclaimer, the term of this patent is extended or adjusted under 35 U.S.C. 154(b) by 156 days.

(21) Appl. No.: 17/174,123

(22) Filed: Feb. 11, 2021

(65) Prior Publication Data

US 2021/0250011 A1    Aug. 12, 2021

Related U.S. Application Data

(60) Provisional application No. 62/972,997, filed on Feb. 11, 2020.

(51) Int. Cl.
*H02P 27/06* (2006.01)
*H02P 23/20* (2016.01)
*H03H 7/01* (2006.01)

(52) U.S. Cl.
CPC .......... *H03H 7/0115* (2013.01); *H02P 23/20* (2016.02); *H02P 27/06* (2013.01)

(58) Field of Classification Search
CPC ........ H02P 27/06; H02P 23/20; H03H 7/0115
(Continued)

(56) References Cited

U.S. PATENT DOCUMENTS 5,686,806 A     11/1997  Hibbard
10,476,381 B1 *  11/2019 Sartler ................. H03H 7/0138
(Continued)

FOREIGN PATENT DOCUMENTS

EP      2408093 A2 *  1/2012  ............ H02M 1/126
JP      2004166495 A *  6/2004  ............. B60L 11/08
JP      2017077132 A    4/2017

OTHER PUBLICATIONS

International Search Report and Written Opinion from International Application No. PCT/US2021/017700 dated Apr. 28, 2021.

*Primary Examiner* — Jorge L Carrasquillo
(74) *Attorney, Agent, or Firm* — Greenberg Traurig, LLP

(57) ABSTRACT

Systems and methods of the present disclosure enable drive filtering with reduced common mode and differential mode harmonics using a drive filter including, common-differential mode inductors connected to an alternating current (AC) power source, where each common-differential mode inductor has a common mode inductance and a differential mode inductance. A differential mode capacitor is connected to each common-differential mode inductors for filtering the differential mode inductances. A first common mode capacitor is connected to each common-differential mode inductor for filtering the common mode inductances, where each first common mode capacitor are commonly connected. A second common mode capacitor is connected to each common-differential mode inductor for filtering the common mode inductances, where each second common mode capacitor are commonly connected. Output contacts are connected to the common-differential mode inductors to connect a load to the AC power source.

20 Claims, 11 Drawing Sheets

(58) Field of Classification Search
USPC .................................... 318/494, 148, 795
See application file for complete search history.

(56) References Cited

U.S. PATENT DOCUMENTS

| | | | |
|---|---|---|---|
| 2006/0043920 A1* | 3/2006 | Baker | H02M 1/126 |
| | | | 318/611 |
| 2006/0227483 A1 | 10/2006 | Akagi | |
| 2008/0174255 A1 | 7/2008 | Schnetzka et al. | |
| 2009/0267431 A1 | 10/2009 | Tallam et al. | |
| 2014/0268933 A1* | 9/2014 | Zhou | H02M 1/12 |
| | | | 363/44 |
| 2015/0349662 A1* | 12/2015 | Jiang | H02M 7/5395 |
| | | | 363/71 |
| 2019/0273429 A1* | 9/2019 | Li | H02P 29/50 |

* cited by examiner

INTEGRATED INVERTER OUTPUT PASSIVE FILTERS FOR ELIMINATING BOTH COMMON MODE AND DIFFERENTIAL MODE HARMONICS IN PULSE-WIDTH MODULATION MOTOR DRIVES AND METHODS OF MANUFACTURE AND USE THEREOF

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in drawings that form a part of this document: MTE Corp., All Rights Reserved.

FIELD OF TECHNOLOGY

The present disclosure generally relates to output filter topologies with defined neutral current return path and methods of manufacture and use thereof.

BACKGROUND OF TECHNOLOGY

Typically, pulse-width modulation (PWM) inverter systems can produce high peak voltages and currents to ground due to common mode voltages, with greater high peak voltage and current risk in systems with longer wires. Such high peak voltages and currents can cause damage to insulation systems, induced shaft voltage, ground leakage and bearing currents, all of which may cause damage to electric motor drive systems.

SUMMARY OF THE DISCLOSURE

The present disclosure includes embodiments of an output filter apparatus including a plurality of filter contacts configured for receiving an initial alternating current from an alternating current (AC) power source; a plurality of common/differential mode inductors connected to the plurality of filter contacts; where each common-differential mode inductor of the plurality of common/differential mode inductors have a common mode inductance and a differential mode inductance; a plurality of differential mode capacitors connected to the plurality of common-differential mode inductors for filtering differential mode inductances; where the plurality of differential mode capacitors are commonly connected at an end of each differential mode capacitor distal to the plurality of common-differential mode inductors; where each differential mode capacitor of the plurality of differential mode capacitors is connected to a respective common-differential mode inductor of the plurality of common-differential mode inductors; a first plurality of common mode capacitors connected to the plurality of common-differential mode inductors for filtering common mode inductances; where the first plurality of common mode capacitors are commonly connected at an end of each common mode capacitor distal to the plurality of common-differential mode inductors; where each common mode capacitor of the first plurality of common mode capacitors is connected to the respective common-differential mode inductor of the plurality of common-differential mode inductors; a second plurality of common mode capacitors connected to the plurality of common-differential mode inductors for filtering common mode inductances; where the second plurality of common mode capacitors are commonly connected at the end of each common mode capacitor distal to the plurality of common-differential mode inductors; where each common mode capacitor of the second plurality of common mode capacitors is connected to the respective common-differential mode output inductor of the plurality of common-differential mode inductors; and a plurality of output contacts connected to the plurality of common-differential mode inductors configured to connect a load to provide a common mode and differential mode filtered alternating current.

The present disclosure includes embodiments of a three-phase motor drive circuit apparatus including a three-phase alternating current (AC) power supply; an adjustable speed drive (ASD) connected to an output of the three-phase AC power supply, and a drive filter. The drive filter includes a plurality of common-differential mode inductors connected to an output of the ASD; where each common-differential mode inductor of the plurality of common-differential mode inductors has a common mode inductance and a differential mode inductance; a plurality of differential mode capacitors connected to the plurality of common-differential mode inductors for filtering differential mode inductances; where the plurality of differential mode capacitors are commonly connected at an end of each differential mode capacitor distal to the plurality of common-differential mode inductors; where each differential mode capacitor of the plurality of differential mode capacitors is connected to a respective common-differential mode inductor of the plurality of common-differential mode inductors; a first plurality of common mode capacitors connected to the plurality of common-differential mode inductors for filtering common mode inductances; where the first plurality of common mode capacitors are commonly connected at an end of each common mode capacitor distal to the plurality of common-differential mode inductors; where each common mode capacitor of the first plurality of common mode capacitors is connected to a respective common-differential mode inductor of the plurality of common-differential mode inductors; a second plurality of common mode capacitors connected to the plurality of common-differential mode inductors for filtering common mode inductances; where the second plurality of common mode capacitors are commonly connected at an end of each common mode capacitor distal to the plurality of common-differential mode inductors; where each common mode capacitor of the second plurality of common mode capacitors is connected to a respective common-differential mode output inductor of the plurality of common-differential mode inductors. A motor is connected to the plurality of common-differential mode inductors.

The present disclosure further includes drive circuits and output filters where each common-differential mode inductor of the plurality of common-differential mode inductors includes: a common-differential mode input inductor having the common mode inductance and the differential mode inductance; a common-differential mode output inductor having the common mode inductance and the differential mode inductance; where the common-differential mode output inductor is connected in series with the common-differential mode input inductor; a tap intermediating between the common-differential mode input inductor and the common-differential mode output inductor; and where the load is connected to each tap to connect the load to the plurality of common-differential mode inductors.

The present disclosure further includes drive circuits and output filters where each differential mode capacitor of the plurality of differential mode capacitors is connected to the common-differential mode output inductor of each common-differential mode inductor, each common mode capacitor of the first plurality of common mode capacitors is connected to the common-differential mode output inductor of each common-differential mode inductor, and each common mode capacitor of the second plurality of common mode capacitors is connected to the common-differential mode output inductor of each common-differential mode inductor.

The present disclosure further includes drive circuits and output filters where: the first plurality of common mode capacitors are connected to a DC+ terminal of a direct current bus of a drive circuit; and the second plurality of common mode capacitors are connected to a DC− terminal of the direct current bus of the drive circuit.

The present disclosure further includes drive circuits and output filters where DC+ terminal and the DC− terminal are separated by a capacitor.

The present disclosure further includes drive circuits and output filters where the first plurality of common mode capacitors and the second plurality of common mode capacitors are each commonly shorted to a ground.

The present disclosure further includes drive circuits and output filters where the AC power source includes a three-phase AC power source, and the plurality of common-differential mode inductors include three common-differential mode inductors The present disclosure further includes drive circuits and output filters where each common-differential mode inductor of the plurality of common-differential mode inductors include: at least one first core segment; at least one second core segment; at least one third core segment; a plurality of common mode gaps; where the plurality of common mode gaps are configured to separate, from each other, the at least one first core segment, the at least one second core segment, and the at least one third core segment; a plurality of differential mode gaps; where the plurality of differential mode gaps are configured to separate, from each other, the at least one first core segment, the at least one second core segment, and the at least one third core segment.

The present disclosure further includes drive circuits and output filters further including an adjustable speed drive (ASD); where the plurality of common-differential mode inductors are connected between the load and the ASD.

The present disclosure further includes drive circuits and output filters further including a plurality of damping resistors connected between the plurality of differential mode capacitors and the plurality of common-differential mode inductors.

BRIEF DESCRIPTION OF DRAWINGS

Various embodiments of the present disclosure are further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

DETAILED DESCRIPTION

Figure 1:
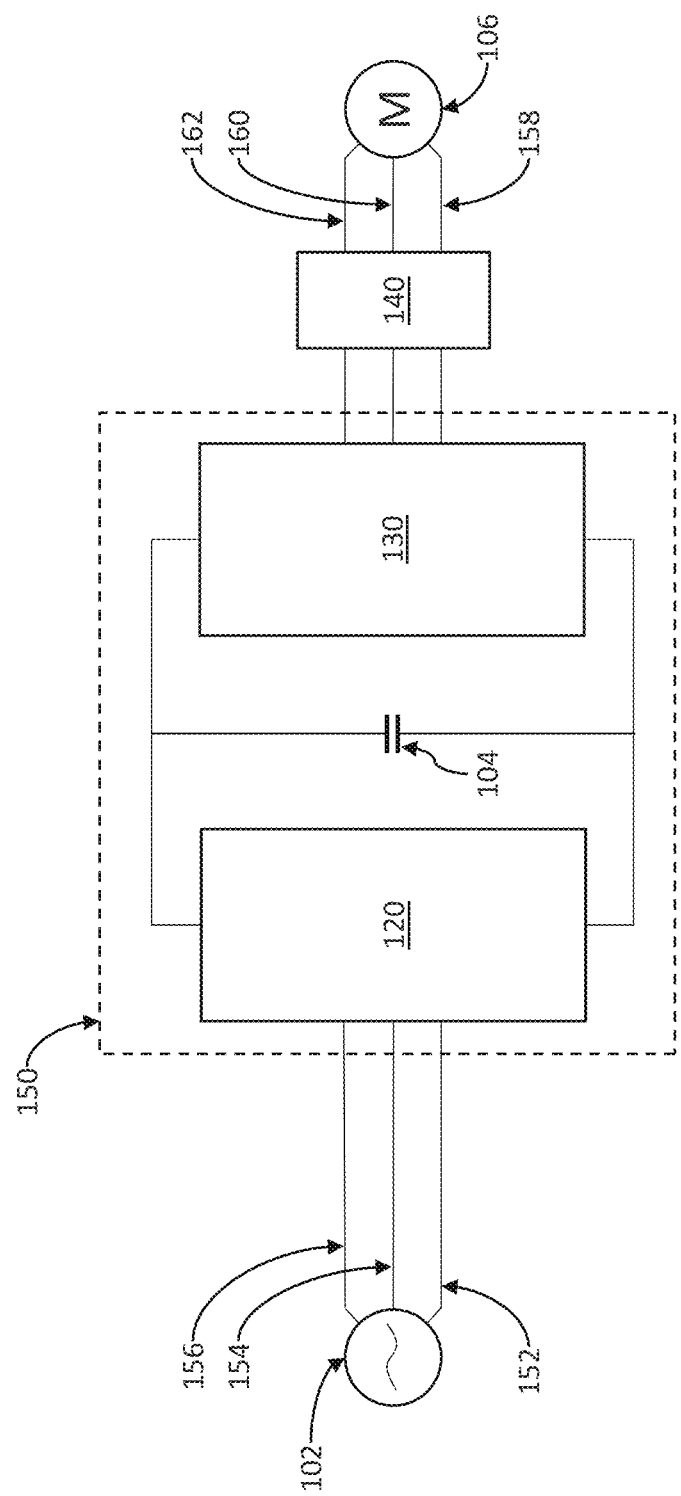
FIG. 1 illustrates an exemplary inventive filter topology in accordance with one or more embodiments of the present disclosure.

Various detailed embodiments of the present disclosure, taken in conjunction with the accompanying figures, are disclosed herein; however, it is to be understood that the disclosed embodiments are merely illustrative. In addition, each of the examples given in connection with the various embodiments of the present disclosure is intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments may be readily combined, without departing from the scope or spirit of the present disclosure.

Throughout the specification and claims, the following terms take the meanings explicitly associated herein, unless the context clearly dictates otherwise. The phrases "In some embodiments" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Further, the terms "substantial," "substantially," "similar," "similarly," "analogous", "analogously," and any combination thereof mean that differences between compared features or characteristics is less than 25% of the respective values/magnitudes in which the compared features or characteristics are measured and/or defined.

In addition, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

In some embodiments of the instant disclosure, an exemplary inventive filter topology with an integrated, passive filter at an inverter output is described leveraging common/different mode inductors having both common mode and differential mode inductances. In some embodiments, the exemplary inventive drive filter topology of the present disclosure may be utilized to eliminate and/or minimize the problem of motor/cable insulation failures, heating, ground leakage, shaft voltages in the motor, bearing failures, and/or audible noise. In some embodiments, the exemplary inventive drive filter topology disclosed by the present disclosure may be utilized to reduce electromagnetic interference (EMI) by eliminating the high dV/dt associated with inverter output waveforms. In some embodiments, added cable protection and the economy of using standard grade electrical wire may be a significant benefit of using the exemplary inventive drive filter topology of the present disclosure to protect against long lead drive-to-motor excess voltage problems. To facilitate such improvements, in some embodiments, the exemplary inventive drive filter topology of the present invention may include a passive, integrated filter topology integrated with the output of, e.g., a PWM inverter. PWM inverters may be used on variable speed drives to power motors. Companies have been benefited from these low cost and efficient drive systems. There has been challenges to reduce the negative effects of the differential mode and common mode voltages that inverter systems produce. Many users are much less familiar with the common mode voltages produced by a PWM inverter that can result in high peak voltages and currents to ground, especially when long cables are used. The common mode voltage (CMV) may not only damage the insulation system of the motor drives, but also induce shaft voltage, ground leakage and bearing currents. The shaft voltage and bearing currents may in turn cause bearing failure. While a sinewave filter in a drive isolation transformer may be implemented using a sinewave filter to reduce the differential mode (DM) harmonics with the drive isolation transformer itself removing most of the common mode voltage. However, where the drive isolation transformer is not required to adjust voltage, it can be a costly solution. Moreover, alternative filter solutions to eliminate PWM common mode (CM) and differential mode (DM) harmonics may include multiple filter sections that address the CM and DM filtering separately. Thus, an integrated filter with passive operation may reduce costs by addressing both CM and DM harmonics concurrently. Accordingly, embodiments of the present invention relate to an easily implemented method to make it suitable to filter both differential mode (CM) and common mode (CM) PWM motor drives.

FIG. 1 illustrates an exemplary inventive filter topology in accordance with one or more embodiments of the present disclosure.

In an embodiment, the exemplary inventive filter topology may include an exemplary integrated drive filter 140 an adjustable speed drive (ASD) 150 and a motor 106. In an embodiment, the drive filter 140 may be a passive common/differential mode filter, however, the drive filter 140 may include any suitable filter with common mode inductance. For example, the ASD 150 would receive electrical power from, e.g., a power grid or a power supply 102. In some embodiments, the motor 106 has a three-phase input and the ASD 150 has a three-phase output as signified by the motor lines 158, 160 and 162. In some embodiments, the drive filter 140 may be interposed between the ASD 150 and the motor 106. In an embodiment, the power supply 102 may be a three-phase alternating current (AC) generator as signified by the wires 152, 154 and 156. In an embodiment, the AC power may be rectified and inverted by the ASD 150 to provide a variable three-phase AC output using, e.g., a converter 120 and an inverter 130 with a capacitor 104 for, e.g., voltage smoothing.

In an embodiment, the exemplary inventive integrated inverter output passive filter topology includes the drive filter 140 including combined common/differential mode filtering. In some embodiments, the drive filter 140 includes both a common mode filter, e.g., utilizing common mode capacitors tuned to create a low pass filter, and a differential mode filter, e.g., utilizing differential mode capacitors tuning an inductance as a differential mode filter or sinewave filter. In some embodiments the differential mode capacitors may be damped with resistors to reduce inrush when the filter is first energized to reduce ringing near resonant frequency of the filter during operation. In some embodiments, the common mode capacitors and differential mode capacitors may be tuned to have a same resonant frequency.

Figure 2:
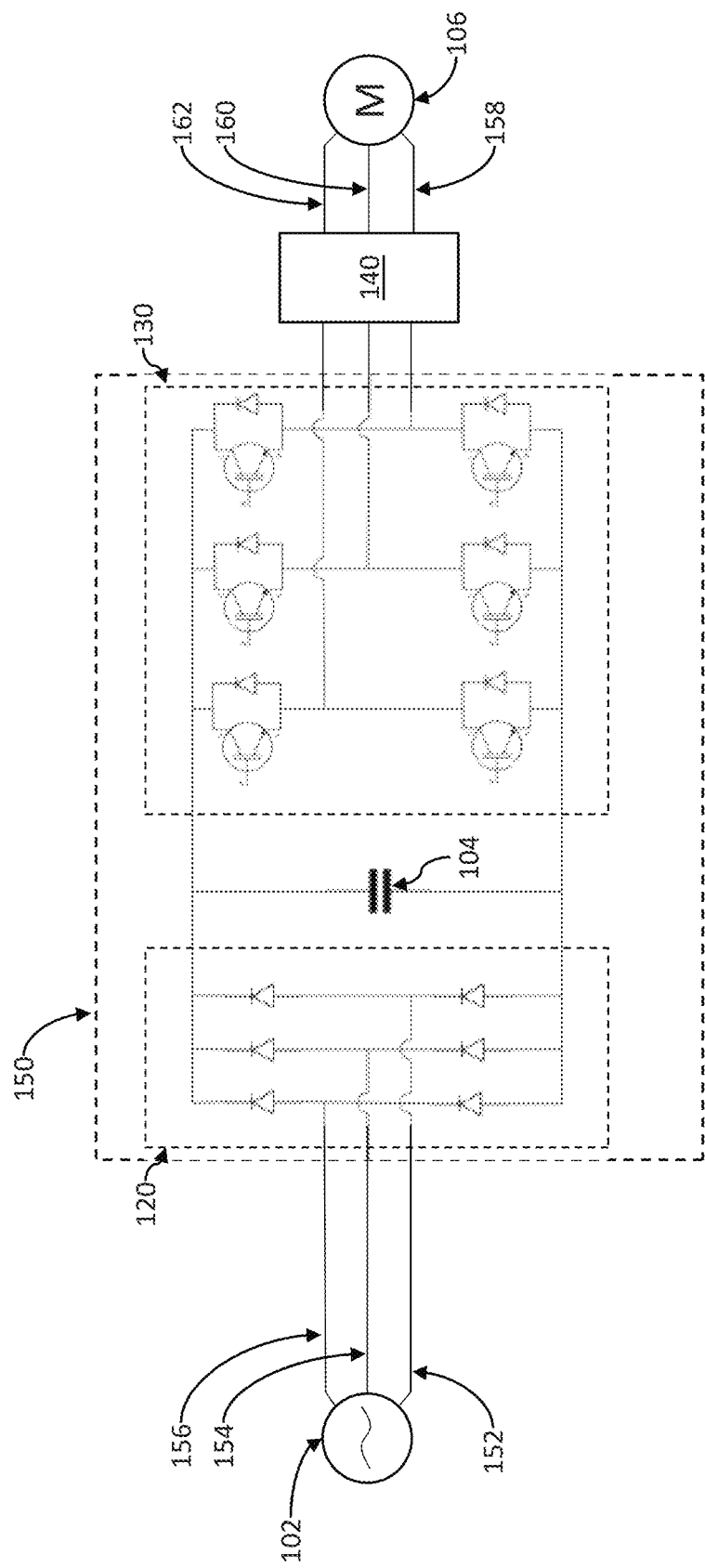
FIG. 2 illustrates an exemplary inventive adjustable speed drive having a PWM converter and PWM inverter for use with an exemplary inventive integrated inverter output passive filter topology in accordance with one or more embodiments of the present invention

FIG. 2 illustrates an exemplary inventive adjustable speed drive having a PWM converter and PWM inverter for use with an exemplary inventive integrated inverter output passive filter topology in accordance with one or more embodiments of the present invention.

In some embodiments, the converter 120 may include an arrangement of diodes corresponding to each of the three phases of the power supply 102 to resulting in current flow in only one direction. Current may then flow to the inverter 130, which may include, e.g., an H-bridge design utilizing transistor switches and antiparallel diodes.

In some embodiments, current would be applied to a converter 120 that would create a direct current (DC) voltage that would then be applied to a DC bus. This DC voltage may be then switched on and off by an inverter 130 at a frequency of about 2 kHz to 20 kHz. Typically, a width of these pulses may be varied to change the motor speed at connections (164, 166, 168). In some embodiments, a typical ASD would have one or more capacitors 104 placed across the DC bus to create a low impedance source. Typically, a size of one or more capacitors 104 to be placed across the DC bus to create a low impedance source may be based, at least in part, upon one or more of the following characteristics, but not limited to: ripple current capability, life requirements, and/or input harmonic current distortion maximums on the input of the ASD drive. In some embodiments, uninterruptable power supply systems and/or inverters also may use capacitors to filter the ripple current on the DC bus and to store energy. In some embodiments, the one or more capacitors 104 of the DC bus has a capacitance of between about 1 and about 20 microfarads (µF) per horse power.

In some embodiments, an initial three-phase alternative current that may be applied to the phases (152, 154, 156) may be, but not limited to, from a three-phase alternative current power system such as a wye connected transformer secondary. The wye connection may have, e.g., three voltages that may be 120 degrees out of phase, and the converter

120 would have, e.g., six rectifiers. Theoretical input current harmonics for rectifier circuits may be a function of pulse number: h=(np+/−1) (1), where "n"=1, 2, 3 . . . , and "p" may be a pulse number. For example, the theoretical lowest harmonic for a six pulse converter may be the fifth. When the power system provides a balanced three phase power, the 6-pulse converter performs close to its theoretical harmonic performance. The three phases (152, 154, 156) on the secondary of the typical delta-wye transformer provide a balanced power to the converter 120. However, other numbers of phases are also considered, such as, e.g., two phase AC, with two voltages that are 180 degrees out of phase and a converter with four rectifiers, or four phase AC, with four voltages that are 90 degrees out of phase and a converter with eight rectifiers, etc.

Figure 3A:
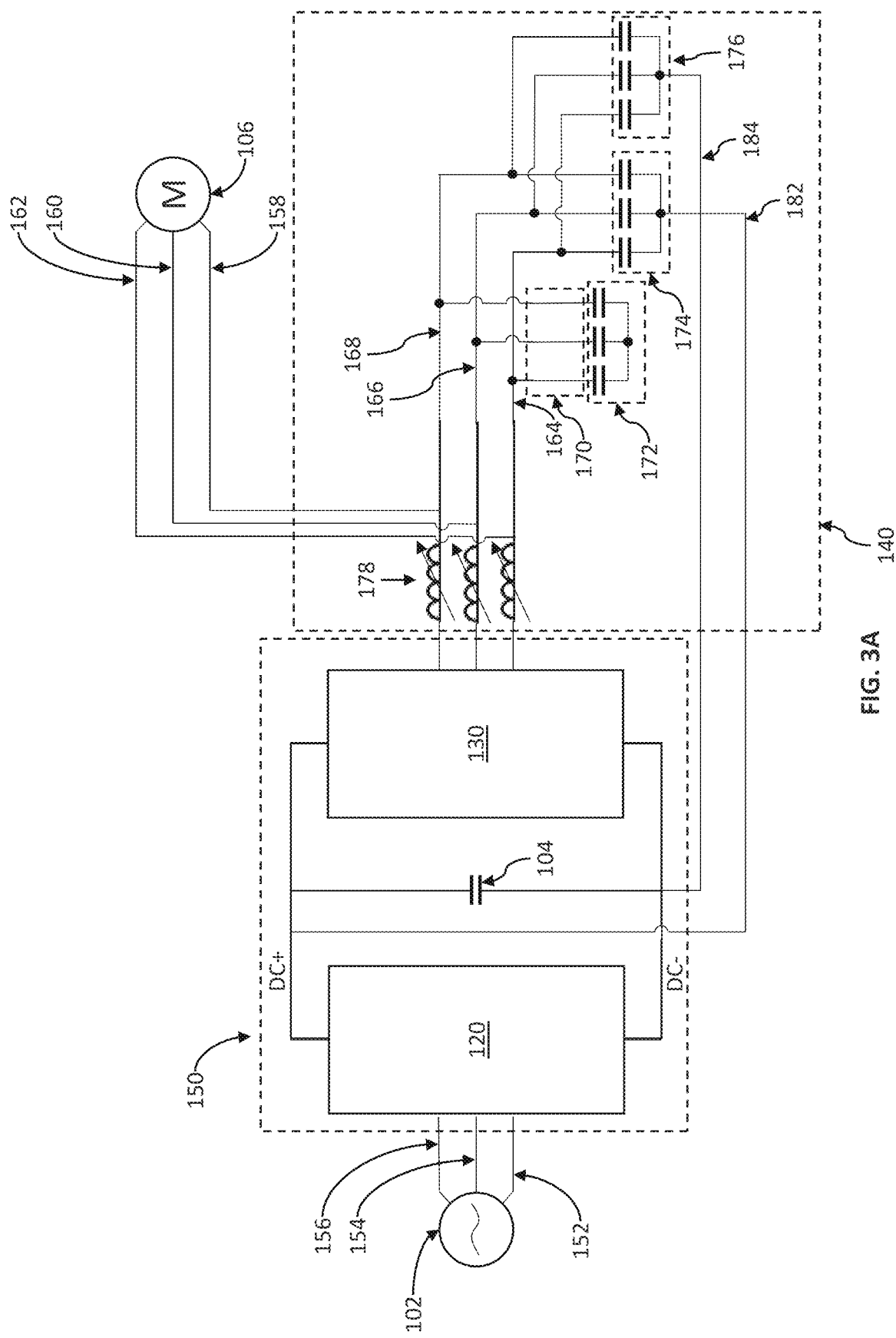
FIG. 3A through 3C illustrate embodiments of exemplary inventive integrated inverter output passive filter topology utilizing DC bus connections in accordance with one or more embodiments of the present invention.

FIG. 3A illustrates another exemplary inventive integrated inverter output passive filter topology in accordance with one or more embodiments of the present invention utilizing common/differential mode inductors 178, differential mode (DM) capacitors 172 and common mode (CM) capacitors 174 and 176 as the drive filter 140.

In some embodiments of the instant invention the common/differential mode inductors 178 are designed to be utilized for drive output filters that provide a nearly sinusoidal output voltage when driven from variable frequency drives or other types of PWM inverters with switching frequencies at least 2 kilohertz (kHz) or more, however other switch frequencies are also contemplated (e.g., at least 1 kHz, at least 0.5 kHz, etc.), such as, e.g., the ASD 150. To form a sinewave filter to reduce DM signals, e.g., a DM filter, the common/differential mode inductors 178 may be tuned with DM capacitors 172 connected to the output inductors 180.

In an embodiment, the common/differential mode inductors 178 may be common/differential mode three phase inductors. Examples of possible common/differential model three phase inductors are described in U.S. Pat. No. 9,613,745, herein incorporated by reference in its entirety. Such inductors have high common mode inductance as well as differential mode inductance using at least one first core segment, at least one core segment, at least one third core segment, or any additional core segments. Gaps between the core segments are configured to separate the core segments to provide common mode gaps and differential mode gaps as described in U.S. 9613,745. For example, a high common mode inductance can be high relative to differential mode inductances, such as, e.g., about 15 times higher common mode inductances relative to differential mode inductances or greater may be considered "high" common mode inductance, or about 20 times higher, or about 25 times higher, or about 30 times higher, etc. The high common mode inductance may facilitate a very low common mode current. For example, the common mode current at the motor 106 depends on the switching frequency and the percentage of load but may be about, e.g., 5% or less than the rating current of the filter. For example, the rating current may be in a range from about, e.g., 5 Amps (A) to about 130 Å or to about 160 Å or more, or the rating current may be between about 1 and about 5 Å or more.

In an embodiment, a load, such as, e.g., a motor 106 may be connected to the common/differential mode inductors 178 via the motor lines 158, 160 and 162 at an output of the common/differential mode inductors 178. In some embodiments, the differential mode inductance may depend on the percentage of impedance of the common/differential mode inductors 178 where the greater the percentage of impedance, the greater the reduction in voltage to the motor 106 would be. In some embodiments, the differential mode inductance is, e.g., about 10% impedance or less, 5% impedance or less, 15% impedance or less, etc., with a common mode inductance that is, e.g., about 15 times, about 20 times, about 25 times, about 30 times or more greater than the differential mode inductance or greater. In some embodiments, the voltage rating may be in a range of about, e.g., 400 volts (V) to about 700 V, or about 480 V to about 600 V, or other suitable range.

In some embodiments, the exemplary drive filter 140 may permit reducing inductor size by combining the differential mode inductor and the common mode inductor, while avoiding or minimizing winding losses, harmonic currents, waste heat, mechanical vibration, proximity effects, gap heating, skin effect, etc. In an embodiment, the common mode capacitors 174 and 176 may be connected to terminals corresponding to common mode inductance loops of the output common/differential mode inductors 178. Similarly, differential mode capacitors 172 may be connected to terminals corresponding to differential mode inductance loops of the common/differential mode inductors 178. Thus, each inductor of the common/differential mode inductors 178 connect to a differential mode capacitor 172 and common mode capacitors 174 and 176 to reduce noise in both differential modes and common modes. In an embodiment, the common mode capacitors 174 and 176 may be each commonly connected at respective ends that are distal to the respective wires 164, 166 and 168. Similarly, the differential mode capacitors 172 may be each commonly connected at respective ends that are distal to the respective wires 164, 166 and 168.

In some embodiments, the common mode capacitors 174 and 176 only need to be rated for a reduced current because common mode current may be very low, due to the high common mode inductance, as described above, of the exemplary common/differential mode inductors 178. In some embodiments, the common mode capacitors 174 and 176 may have a current in a range of about, e.g., about 0.1 Å to about 10 Å, about 0.2 Å to about 5 Å, about 0.27 Å to about 3.3 Å, or other suitable range depending on the rated filter current. In some embodiments, the rated filter current may correspond to a line voltage for about, e.g., 400 volts (V) to about 700 V, or about 480 V to about 600 V, or other suitable range.

common/differential mode inductors 178 drive filter 140. Additionally, in some embodiments, the filter 140 may permit reducing inductor size by combining the differential mode inductor and a common mode inductor in the common/differential mode common/differential mode inductors 178. The CM inductance J is tuned with common mode capacitors 174 and 176 to create a low pass filter with resonance frequency is the same as the DM filter formed with the DM capacitors 172. The common/differential mode common/differential mode inductors 178 intermediates between the ASD 150 and the motor 106. The common/differential mode inductors 178 may be of the passive adaptive type. The filter 140, may permit reducing inductor size, while avoiding issues pertaining to winding losses, harmonic currents, etc., associated with reducing the size of the typical L-R-C filter. This greater latitude in reducing common/differential mode inductors 178 size is due in part to the arrangement of the coils and the connections of the motor lines 158, 160, 162 to tap terminals at outputs of windings of the common/differential mode inductors 178. The common/differential mode inductors 178 are coupled to the ASD 150 at terminals and has a plurality of windings, each of which have a variable inductance attributable to the common/differential mode inductors 178 being of a passive adaptive type.

In some embodiments, the CM capacitors 174 and 176 are connected to DC+ and DC− of the DC bus between the converter 120 and the inverter 130 of the ASD 150. Thus, the CM capacitors 174 in connection with the DC+ end of the DC bus via DC bus connection 182 forms a positive CM filter, while the CM capacitors 176 in connection the DC− end of the DC bus via DC bus connection 184 forms a negative CM filter to filter positive and negative, respectively, voltage and current spikes. Accordingly, in some embodiments, there are two set of the common mode capacitors 174 and 176 connected in parallel and each neutral point of the common mode capacitors 174 and 176 connected to the DC link. Since the common mode inductance may be large, as described above, the CM capacitors 174 and 176 may have very small currents that are connected to DC bus.

Figure 5:
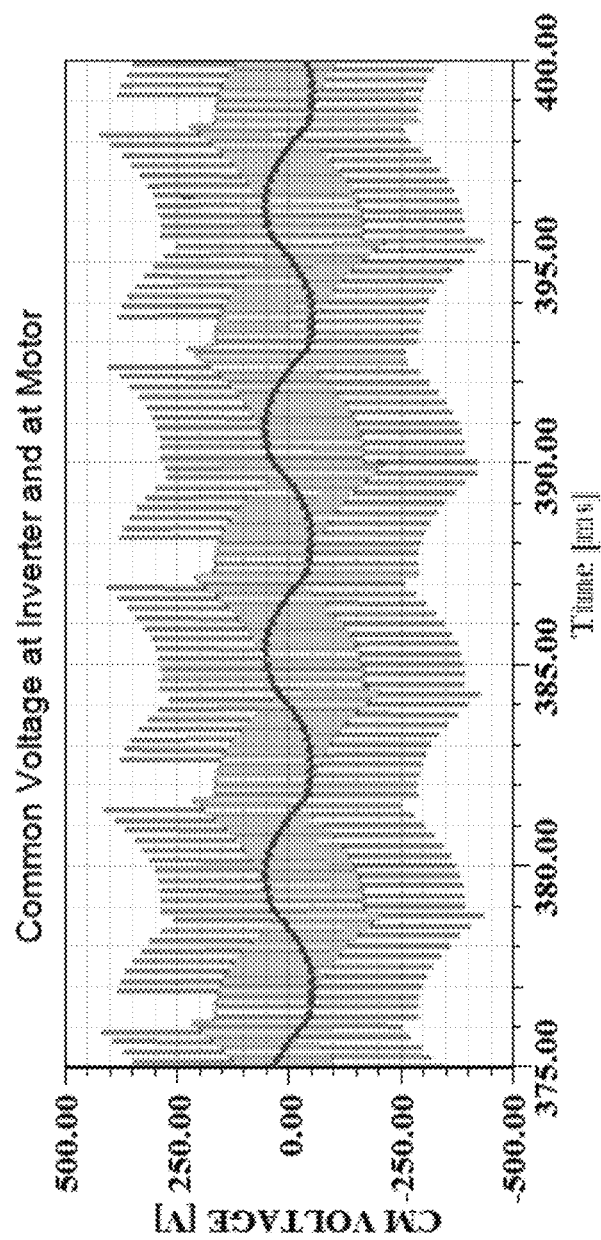
FIG. 5 illustrates CM voltage at an inverter and at a motor before and after using integrated drive filter of FIGS. 3 and 4 above.
Figure 6:
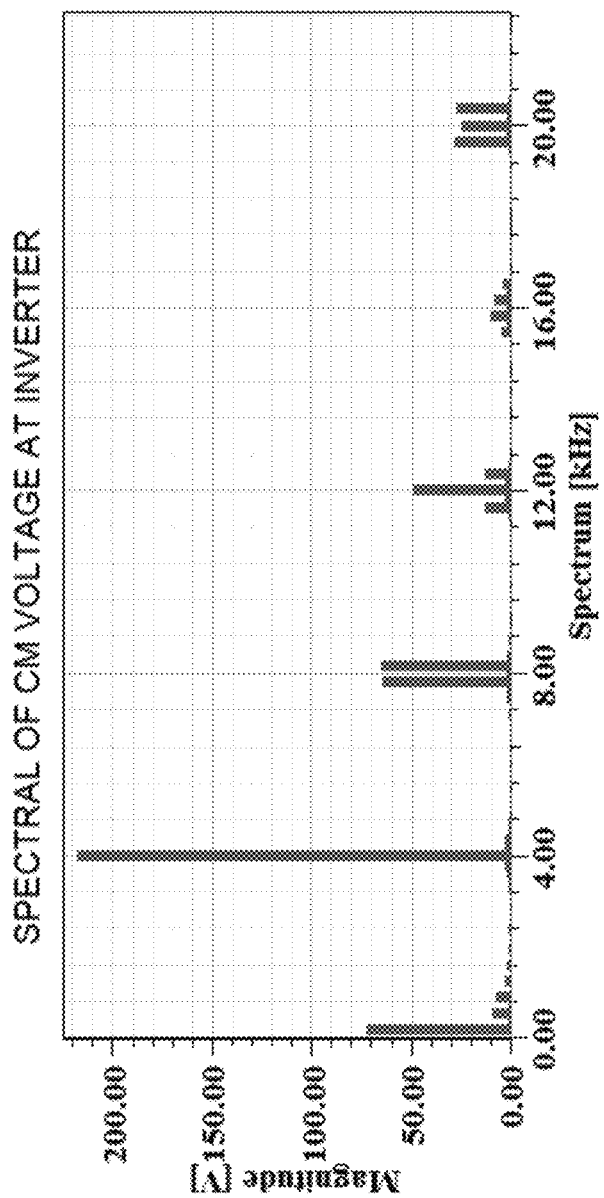
FIG. 6 illustrates the spectrum of CM voltage at an inverter after using integrated drive filter of FIGS. 3 and 4 above.
Figure 7:
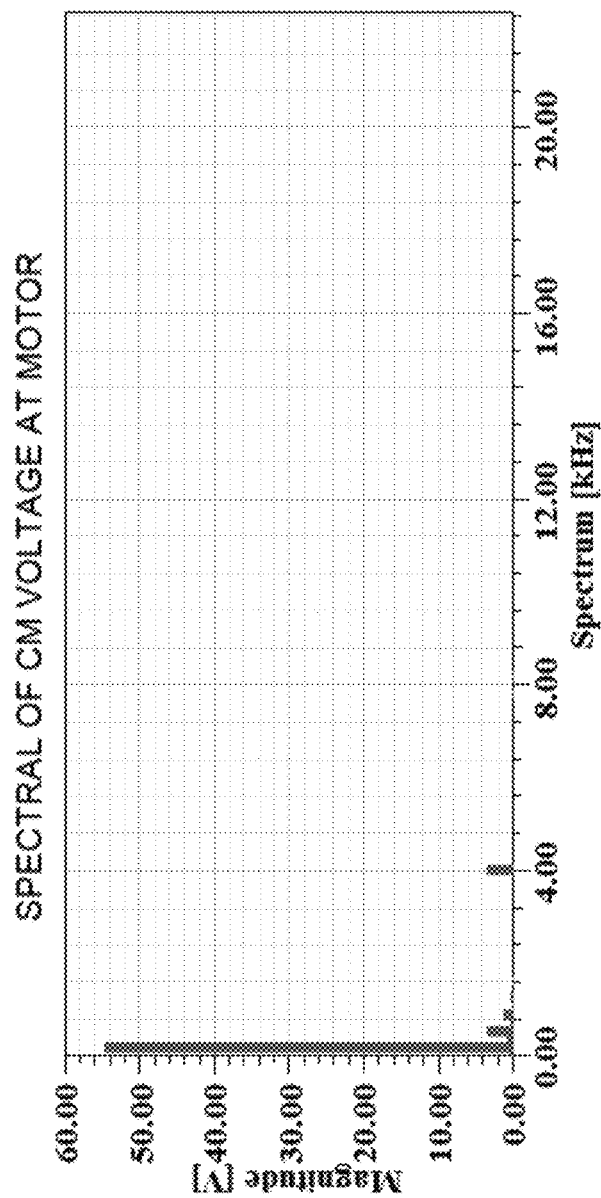
FIG. 7 illustrates the spectrum of CM voltage at a motor after using integrated drive filter of FIGS. 3A-3C and 4A-4C above.

In some embodiments, an integrated DM and CM drive filter 140 can remove more than, e.g., 90% of all high amplitudes of harmonics frequency around switching frequency and sidebands of its integral multiples as shown in FIG. 5-7.

Figure 3B:
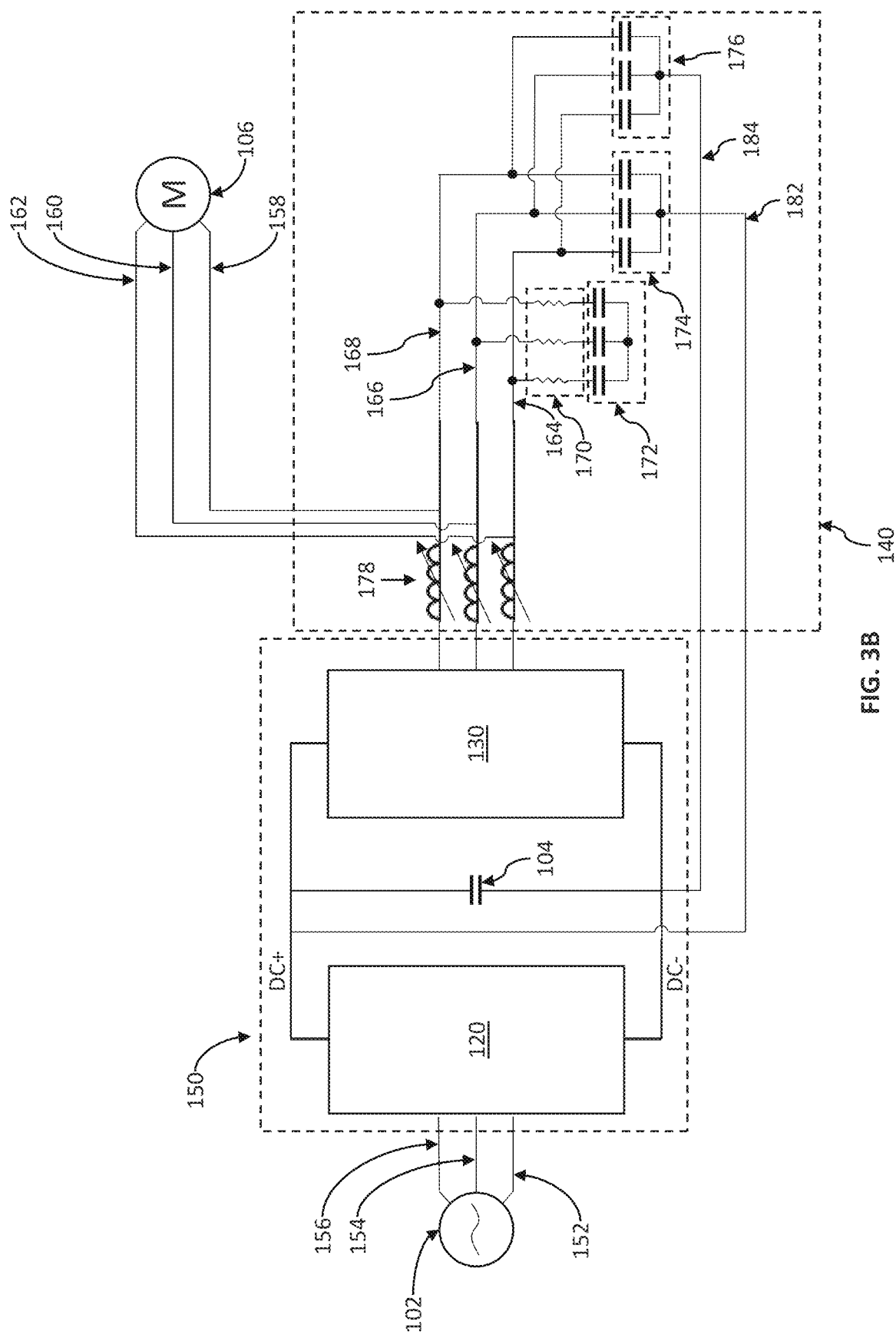

FIG. 3B illustrates another exemplary inventive integrated inverter output passive filter topology in accordance with one or more embodiments of the present invention utilizing common/differential mode inductors 178, differential mode (DM) capacitors 172 and common mode (CM) capacitors 174 and 176 as the drive filter 140.

In some embodiments of the instant invention the common/differential mode inductors 178 are designed to be utilized for drive output filters that provide a nearly sinusoidal output voltage when driven from variable frequency drives or other types of PWM inverters with switching frequencies at least 2 kilohertz (kHz) or more, however other switch frequencies are also contemplates (e.g., at least 1 kHz, at least 0.5 kHz, etc.), such as, e.g., the ASD 150. To form a sinewave filter to reduce DM signals, e.g., a DM filter, the common/differential mode inductors 178 may be tuned with DM capacitors 172 connected to the.

In an embodiment, the common/differential mode inductors 178 may be common/differential mode three phase inductors. Examples of possible common/differential model three phase inductors are described in U.S. 9,613,745. Such inductors have high common mode inductance as well as differential mode inductance. For example, a high common mode inductance can be high relative to differential mode inductances, such as a about 15 times higher common mode inductances relative to differential mode inductances or greater may be considered "high" common mode inductance, or about 20 times higher, or about 25 times higher, or about 30 times higher, etc. The high common mode inductance may facilitate a very low common mode current. For example, the common mode current at the motor 106 depends on the switching frequency and the percentage of load but may be about, e.g., 5% or less than the rating current of the filter. For example, the rating current may be in a range from about, e.g., 5 Amps (A) to about 130 Å or to about 160 Å or more, or the rating current may be between about 1 and about 5 Å or more.

In an embodiment, a load, such as, e.g., a motor 106 may be connected to the common/differential mode inductors 178 via the motor lines 158, 160 and 162 at an output of the common/differential mode inductors 178. In some embodiments, the differential mode inductance may depend on the percentage of impedance of the common/differential mode inductors 178, there the greater the percentage of impedance, the greater the reduction in voltage to the motor 106. In some embodiments, the differential mode inductance is, e.g., about 10% impedance or less, 5% impedance or less, 15% impedance or less, etc., with a common mode inductance that is, e.g., about 15 times, about 20 times, about 25 times, about 30 times or more greater than the differential mode inductance or greater. In some embodiments, the voltage rating may be in a range of about, e.g., 400 volts (V) to about 700 V, or about 480 V to about 600 V, or other suitable range.

In some embodiments, the exemplary drive filter 140 may permit reducing inductor size by combining the differential mode inductor and the common mode inductor, while avoiding or minimizing winding losses, harmonic currents, waste heat, mechanical vibration, proximity effects, gap heating, skin effect, etc. In an embodiment, the common mode capacitors 174 and 176 may be connected to terminals corresponding to common mode inductance loops of the. Similarly, differential mode capacitors 172 may be connected to terminals corresponding to differential mode inductance loops of the. Thus, each inductor of the connect to a differential mode capacitor 172 and common mode capacitors 174 and 176 to reduce noise in both differential modes and common modes. In an embodiment, the common mode capacitors 174 and 176 may be each commonly connected at respective ends that are distal to the respective wires 164, 166 and 168. Similarly, the differential mode capacitors 172 may be each commonly connected at respective ends that are distal to the respective wires 164, 166 and 168.

In some embodiments, the common mode capacitors 174 and 176 only need to be rated for a reduced current because common mode current may be very low, due to the high common mode inductance, as described above, of the exemplary common/differential mode inductors 178. In some embodiments, the common mode capacitors 174 and 176 may have a current in a range of about, e.g., about 0.1 Å to about 10 Å, about 0.2 Å to about 5 Å, about 0.27 Å to about 3.3 Å, or other suitable range depending on the rated filter current. In some embodiments, the rated filter current may correspond to a line voltage for about, e.g., 400 volts (V) to about 700 V, or about 480 V to about 600 V, or other suitable range.

However, in some embodiments, the DM filtering by the combination of the common/differential mode inductors 178 and the DM capacitors 172 may require damping. This damping may be achieved by interposing e.g., resistors 170 between the DM capacitors 172 and the to reduce inrush when the filter is first energized to reduce ringing in a near resonant frequency of the filter during operation. In some embodiments, the exemplary resistors 170 may each have a resistance in a range of about of about, e.g., 7 Ohm or less, about 5 Ohm or less, 3 Ohm or less or other suitable resistance. In some embodiments, for some applications, the drive filter 140 may be utilized without additional damping.

Additionally, in some embodiments, the filter 140 may permit reducing inductor size by combining the differential mode inductor and a common mode inductor in the common/differential mode inductors 178. The CM inductance J is tuned with common mode capacitors 174 and 176 to create a low pass filter with resonance frequency is the same as the DM filter formed with the DM capacitors 172 and resistors 170. The common/differential mode inductors 178 intermediates between the ASD 150 and the motor 106. The common/differential mode inductors 178 may be of the passive adaptive type. The filter 140, may permit reducing inductor size, while avoiding issues pertaining to winding losses, harmonic currents, etc., associated with reducing the size of the typical L-R-C filter. This greater latitude in reducing the size of the common/differential mode inductors 178 is due in part to the arrangement of the coils and the connections of the motor lines 158, 160, 162 to tap terminals at the output of windings of the common/differential mode inductors 178. The common/differential mode inductors 178 is coupled to the ASD 150 at terminals and has a plurality of windings, each of which have a variable inductance attributable to the common/differential mode inductors 178 being of a passive adaptive type.

In some embodiments, the CM capacitors 174 and 176 are connected to DC+ and DC− of the DC bus between the converter 120 and the inverter 130 of the ASD 150. Thus, the CM capacitors 174 in connection with the DC+ end of the DC bus via DC bus connection 182 forms a positive CM filter, while the CM capacitors 176 in connection the DC− end of the DC bus via DC bus connection 184 forms a negative CM filter to filter positive and negative, respectively, voltage and current spikes. Accordingly, in some embodiments, there are two set of the common mode capacitors 174 and 176 connected in parallel and each neutral point of the common mode capacitors 174 and 176 connected to the DC link. Since the common mode inductance may be large, as described above, the CM capacitors 174 and 176 may have very small currents that are connected to DC bus.

In some embodiments, an integrated DM and CM drive filter 140 can remove more than, e.g., 90% of all high amplitudes of harmonics frequency around switching frequency and sidebands of its integral multiples as shown in FIG. 5-7.

Figure 3C:
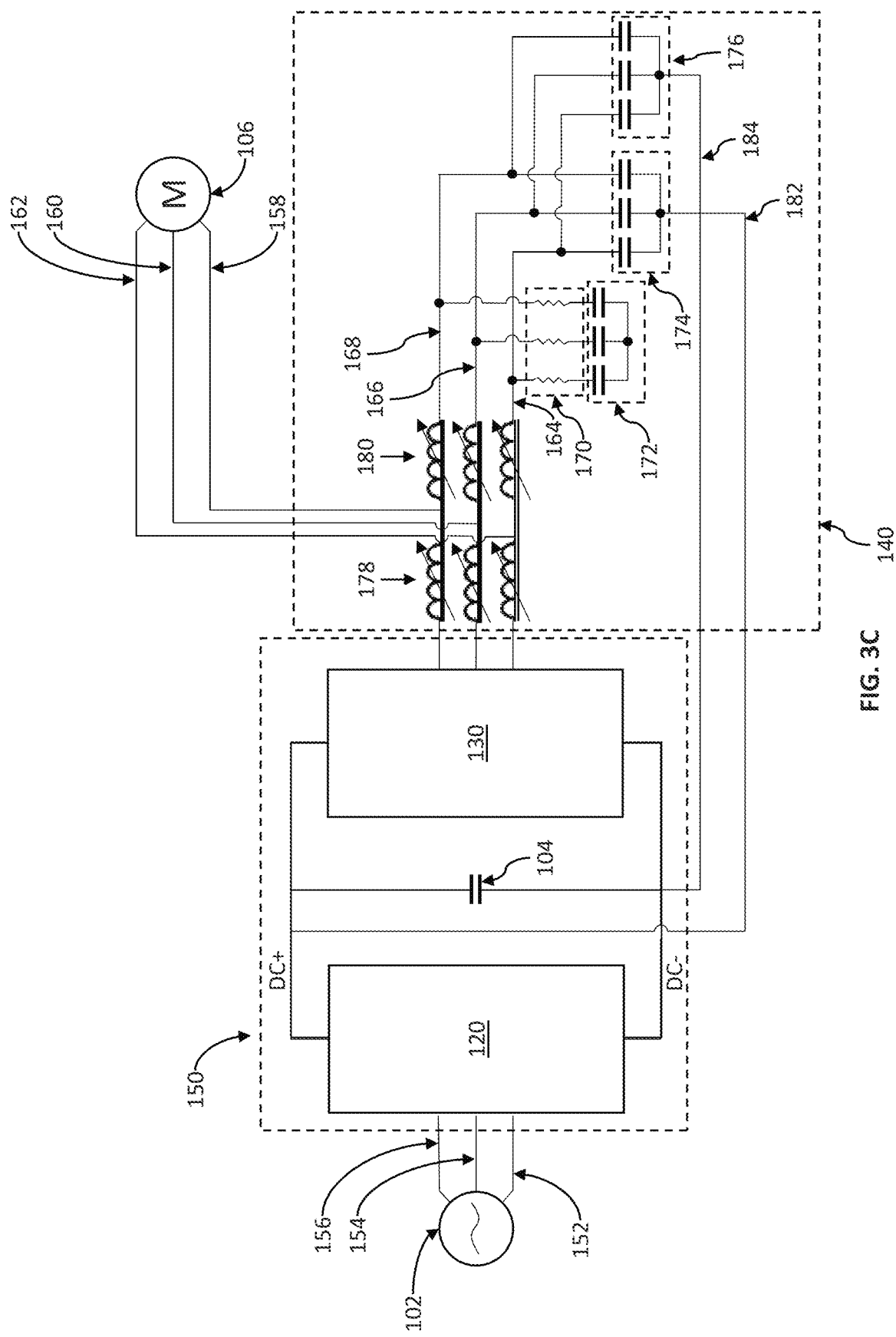

FIG. 3C illustrate another exemplary inventive integrated inverter output passive filter topology in accordance with one or more embodiments of the present invention utilizing input common/differential mode inductors 178, output common/differential mode inductors 180, differential mode (DM) capacitors 172 and common mode (CM) capacitors 174 and 176 as the drive filter 140.

In some embodiments of the instant invention the input common/differential mode inductors 178 and output common/differential mode inductors 180 are designed to be utilized for drive output filters that provide a nearly sinusoidal output voltage when driven from variable frequency drives or other types of PWM inverters with switching frequencies at least 2 kilohertz (kHz) or more, however other switch frequencies are also contemplates (e.g., at least 1 kHz, at least 0.5 kHz, etc.), such as, e.g., the ASD 150. In some embodiments of the instant invention, the input common/differential mode inductors 178 are coupled to the output common/differential mode inductors 180 to increase inductance. To form a sinewave filter to reduce DM signals, e.g., a DM filter, the common/differential mode inductors 178 and 180 may be tuned with DM capacitors 172 connected to the output common/differential mode inductors 180.

In an embodiment, the common/differential mode inductors 178 and 180 may be common/differential mode three phase inductors. Examples of possible common/differential model three phase inductors are described in U.S. Pat. No. 9,613,745. Such inductors have high common mode inductance as well as differential mode inductance. For example, a high common mode inductance can be high relative to differential mode inductances, such as, e.g., about 15 times higher common mode inductances relative to differential mode inductances or greater may be considered "high"

common mode inductance, or about 20 times higher, or about 25 times higher, or about 30 times higher, etc. The high common mode inductance may facilitate a very low common mode current. For example, the common mode current at the motor 106 depends on the switching frequency and the percentage of load but may be about, e.g., 5% or less than the rating current of the filter. For example, the rating current may be in a range from about, e.g., 5 Amps (A) to about 130 Å or to about 160 Å or more, or the rating current may be between about 1 and about 5 Å or more.

In an embodiment, a load, such as, e.g., a motor 106 may be connected to the common/differential mode inductors 178 and 180 via the motor lines 158, 160 and 162 interposed between the input common/differential mode inductors 178 and the output common/differential mode inductors 180. In some embodiments, the differential mode inductance may depend on the percentage of impedance of the common/differential mode inductors 178 and 180, there the greater the percentage of impedance, the greater the reduction in voltage to the motor 106. In some embodiments, the differential mode inductance is, e.g., about 10% impedance or less, 5% impedance or less, 15% impedance or less, etc., with a common mode inductance that is, e.g., about 15 times, about 20 times, about 25 times, about 30 times or more greater than the differential mode inductance or greater. In some embodiments, the voltage rating may be in a range of about, e.g., 400 volts (V) to about 700 V, or about 480 V to about 600 V, or other suitable range.

In some embodiments, the exemplary drive filter 140 may permit reducing inductor size by combining the differential mode inductor and the common mode inductor, while avoiding or minimizing winding losses, harmonic currents, waste heat, mechanical vibration, proximity effects, gap heating, skin effect, etc. In an embodiment, the common mode capacitors 174 and 176 may be connected to terminals corresponding to common mode inductance loops of the output common/differential mode inductors 180. Similarly, differential mode capacitors 172 may be connected to terminals corresponding to differential mode inductance loops of the output common/differential mode inductors 180. Thus, each inductor of the output common/differential mode inductors 180 connect to a differential mode capacitor 172 and common mode capacitors 174 and 176 to reduce noise in both differential modes and common modes. In an embodiment, the common mode capacitors 174 and 176 may be each commonly connected at respective ends that are distal to the respective wires 164, 166 and 168. Similarly, the differential mode capacitors 172 may be each commonly connected at respective ends that are distal to the respective wires 164, 166 and 168.

In some embodiments, the common mode capacitors 174 and 176 only need to be rated for a reduced current because common mode current may be very low, due to the high common mode inductance, as described above, of the exemplary common/differential mode inductors 178 and 180. In some embodiments, the common mode capacitors 174 and 176 may have a current in a range of about, e.g., about 0.1 Å to about 10 Å, about 0.2 Å to about 5 Å, about 0.27 Å to about 3.3 Å, or other suitable range depending on the rated filter current. In some embodiments, the rated filter current may correspond to a line voltage for about, e.g., 400 volts (V) to about 700 V, or about 480 V to about 600 V, or other suitable range.

However, in some embodiments, the DM filtering by the combination of the common/differential mode inductors 178 and 180 and the DM capacitors 172 may require damping. This damping may be achieved by interposing e.g., resistors 170 between the DM capacitors 172 and the output common/differential mode inductors 180 to reduce inrush when the filter is first energized to reduce ringing in a near resonant frequency of the filter during operation. In some embodiments, the exemplary resistors 170 may each have a resistance in a range of about of about, e.g., 7 Ohm or less, about 5 Ohm or less, 3 Ohm or less or other suitable resistance. In some embodiments, for some applications, the drive filter 140 may be utilized without additional damping.

Additionally, in some embodiments, the filter 140 may permit reducing inductor size by combining the differential mode inductor and a common mode inductor in the input common/differential mode inductors 178 and output common/differential mode inductors 180. The CM inductance J is tuned with common mode capacitors 174 and 176 to create a low pass filter with resonance frequency is the same as the DM filter formed with the DM capacitors 172 and resistors 170. The input common/differential mode inductors 178 and output common/differential mode inductors 180 intermediates between the ASD 150 and the motor 106. The common/differential mode inductors 178 and 180 may be of the passive adaptive type. The filter 140, may permit reducing inductor size, while avoiding issues pertaining to winding losses, harmonic currents, etc., associated with reducing the size of the typical L-R-C filter. This greater latitude in reducing common/differential mode inductors 178 and 180 size is due in part to the arrangement of the coils and the connections of the motor lines 158, 160, 162 to tap terminals intermediate windings of the input common/differential mode inductors 178 and the output common/differential mode inductors 180, respectively. The common/differential mode inductors 178 and 180 is coupled to the ASD 150 at terminals and has a plurality of windings, each of which have a variable inductance attributable to the common/differential mode inductors 178 and 180 being of a passive adaptive type.

In some embodiments, the CM capacitors 174 and 176 are connected to DC+ and DC− of the DC bus between the converter 120 and the inverter 130 of the ASD 150. Thus, the CM capacitors 174 in connection with the DC+ end of the DC bus via DC bus connection 182 forms a positive CM filter, while the CM capacitors 176 in connection the DC− end of the DC bus via DC bus connection 184 forms a negative CM filter to filter positive and negative, respectively, voltage and current spikes. Accordingly, in some embodiments, there are two set of the common mode capacitors 174 and 176 connected in parallel and each neutral point of the common mode capacitors 174 and 176 connected to the DC link. Since the common mode inductance may be large, as described above, the CM capacitors 174 and 176 may have very small currents that are connected to DC bus.

In some embodiments, an integrated DM and CM drive filter 140 can remove more than, e.g., 90% of all high amplitudes of harmonics frequency around switching frequency and sidebands of its integral multiples as shown in FIG. 5-7.

Figure 4A:
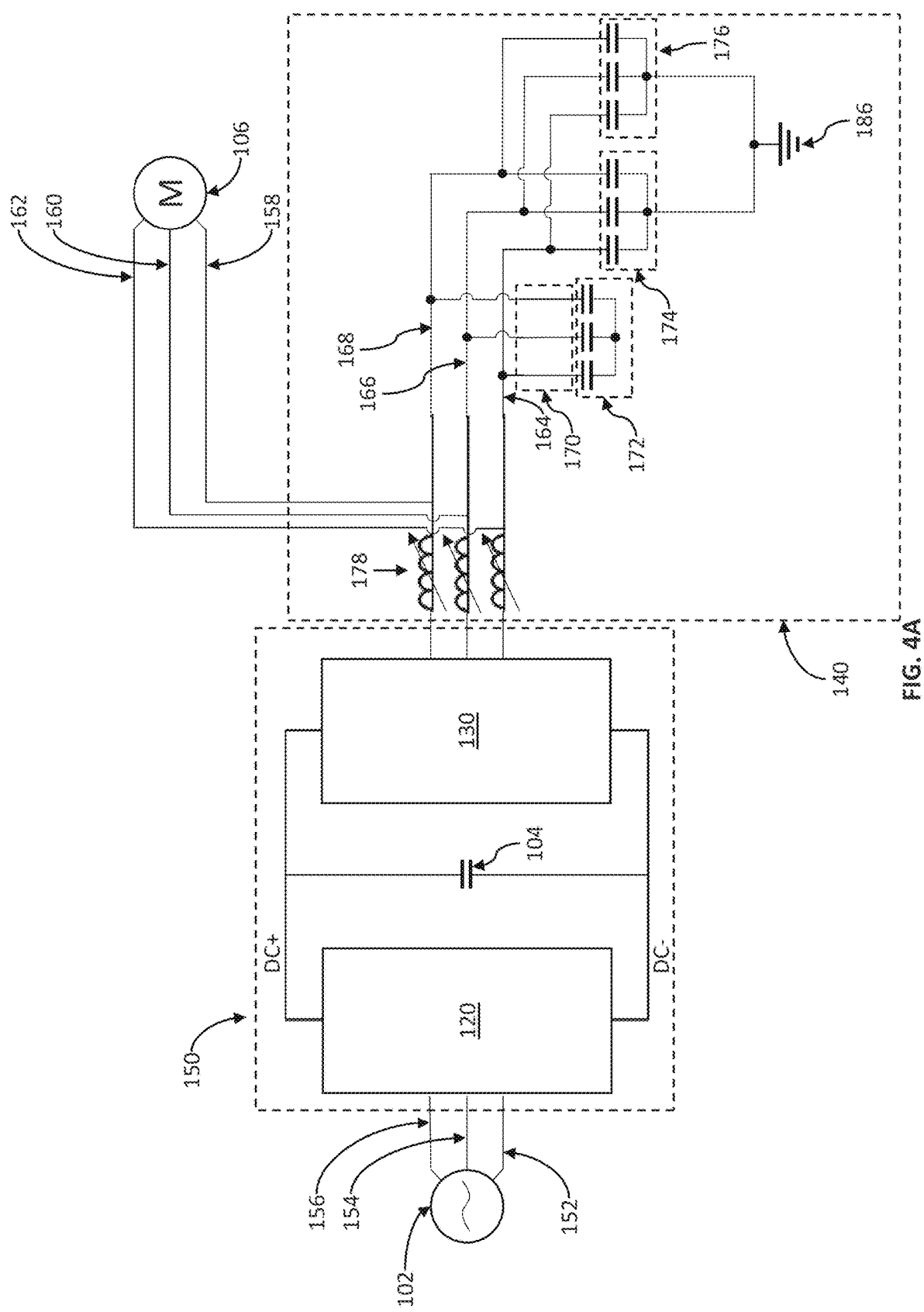
FIG. 4A through 4C illustrate embodiments of exemplary inventive integrated inverter output passive filter topology utilizing a grounded drive filter in accordance with one or more embodiments of the present invention.

FIG. 4A illustrates another exemplary inventive integrated inverter output passive filter topology in accordance with one or more embodiments of the present invention utilizing common/differential mode inductors 178, differential mode (DM) capacitors 172 and common mode (CM) capacitors 174 and 176 as the drive filter 140.

In some embodiments of the instant invention the common/differential mode inductors 178 are designed to be utilized for drive output filters that provide a nearly sinusoidal output voltage when driven from variable frequency drives or other types of PWM inverters with switching frequencies at least 2 kilohertz (kHz), such as, e.g., the ASD 150. To form a sinewave filter to reduce DM signals, e.g., a DM filter, the common/differential mode inductors 178 may be tuned with DM capacitors 172 connected to the common/differential mode inductors 178.

In an embodiment, the common/differential mode inductors 178 may be common/differential mode three phase inductors. Such inductors have very high common mode inductance as well as differential mode inductance. The high common mode inductance may facilitate a very low common mode current. In an embodiment, a load, such as, e.g., a motor 106 may be connected to the common/differential mode inductors 178 via the motor lines 158, 160 and 162 at an output of the common/differential mode inductors 178.

In some embodiments, the exemplary drive filter 140 may permit reducing inductor size by combining the differential mode inductor and the common mode inductor, while avoiding or minimizing winding losses, harmonic currents, waste heat, mechanical vibration, proximity effects, gap heating, skin effect, etc. In an embodiment, the common mode capacitors 174 and 176 may be connected to terminals corresponding to common mode inductance loops of the common/differential mode inductors 178. Similarly, differential mode capacitors 172 may be connected to terminals corresponding to differential mode inductance loops of the common/differential mode inductors 178. Thus, each inductor of the common/differential mode inductors 178 connect to a differential mode capacitor 172 and common mode capacitors 174 and 176 to reduce noise in both differential modes and common modes. In an embodiment, the common mode capacitors 174 and 176 may be each commonly connected at respective ends that are distal to the respective wires 164, 166 and 168. Similarly, the differential mode capacitors 172 may be each commonly connected at respective ends that are distal to the respective wires 164, 166 and 168.

In some embodiments, the common mode capacitors 174 and 176 only need to be rated for a reduced current because common mode current may be very low, due to the high common mode inductance of the exemplary common/differential mode common/differential mode inductors 178. common/differential mode inductors 178 drive filter 140. Additionally, in some embodiments, the filter 140 may permit reducing inductor size by combining the differential mode inductor and a common mode inductor in the common/differential mode inductors 178. The CM inductance J is tuned with common mode capacitors 174 and 176 to create a low pass filter with resonance frequency is the same as the DM filter formed with the DM capacitors 172. The common/differential mode inductors 178 intermediates between the ASD 150 and the motor 106. The common/differential mode inductors 178 may be of the passive adaptive type. The filter 140, may permit reducing inductor size, while avoiding issues pertaining to winding losses, harmonic currents, etc., associated with reducing the size of the typical L-R-C filter. This greater latitude in reducing common/differential mode inductors 178 size is due in part to the arrangement of the coils and the connections of the motor lines 158, 160, 162 to tap terminals at the output of windings of the common/differential mode inductors 178. The common/differential mode inductors 178 is coupled to the ASD 150 at terminals and has a plurality of windings, each of which have a variable inductance attributable to the common/differential mode inductors 178 being of a passive adaptive type.

In some embodiments, the DC bus of the ASD 150 may not be accessible. Thus, the DC+ terminal of CM capacitors 174 and DC− terminals of CM capacitors 176 may be shorted together and connected to the ground 186. Thus, in some embodiments, the ASD 150 may include DC output terminals for connecting to, unlike other drive circuits, thus allowing a user or configuration to connect to the DC bus.

In some embodiments, an integrated DM and CM drive filter 140 can remove more than, e.g., 90% of all high amplitudes of harmonics frequency around switching frequency and sidebands of its integral multiples as shown in FIG. 5-7.

Figure 4B:
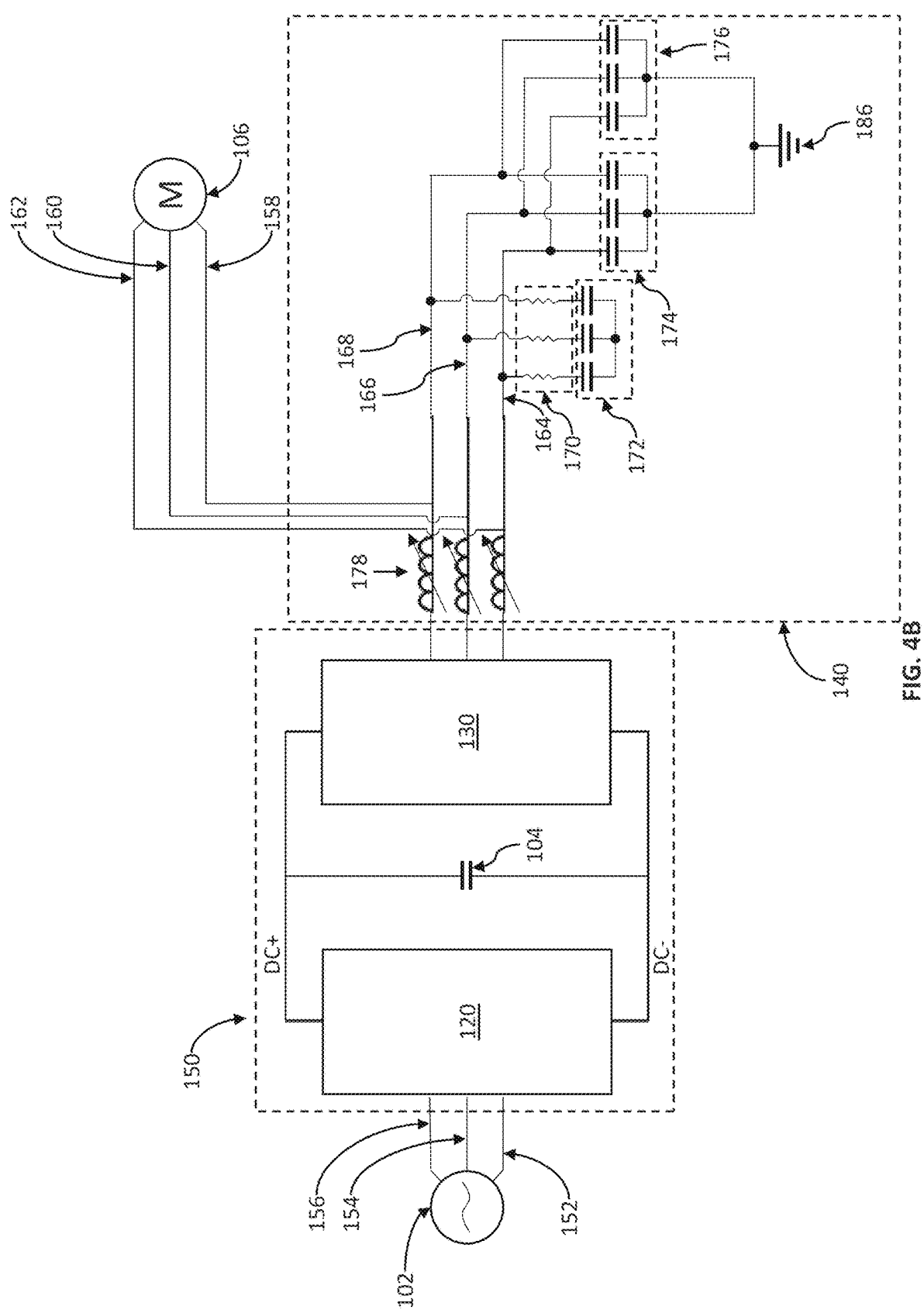

FIG. 4B illustrates another exemplary inventive integrated inverter output passive filter topology in accordance with one or more embodiments of the present invention utilizing common/differential mode inductors 178, differential mode (DM) capacitors 172 and common mode (CM) capacitors 174 and 176 as the drive filter 140.

In some embodiments of the instant invention the common/differential mode inductors 178 are designed to be utilized for drive output filters that provide a nearly sinusoidal output voltage when driven from variable frequency drives or other types of PWM inverters with switching frequencies at least 2 kilohertz (kHz), such as, e.g., the ASD 150. To form a sinewave filter to reduce DM signals, e.g., a DM filter, the common/differential mode inductors 178 may be tuned with DM capacitors 172 connected to the common/differential mode inductors 178.

In an embodiment, the common/differential mode inductors 178 may be common/differential mode three phase inductors. Such inductors have very high common mode inductance as well as differential mode inductance. The high common mode inductance may facilitate a very low common mode current. In an embodiment, a load, such as, e.g., a motor 106 may be connected to the common/differential mode inductors 178 via the motor lines 158, 160 and 162 at an output of the common/differential mode inductors 178.

In some embodiments, the exemplary drive filter 140 may permit reducing inductor size by combining the differential mode inductor and the common mode inductor, while avoiding or minimizing winding losses, harmonic currents, waste heat, mechanical vibration, proximity effects, gap heating, skin effect, etc. In an embodiment, the common mode capacitors 174 and 176 may be connected to terminals corresponding to common mode inductance loops of the common/differential mode inductors 178. Similarly, differential mode capacitors 172 may be connected to terminals corresponding to differential mode inductance loops of the common/differential mode inductors 178. Thus, each inductor of the common/differential mode inductors 178 connect to a differential mode capacitor 172 and common mode capacitors 174 and 176 to reduce noise in both differential modes and common modes. In an embodiment, the common mode capacitors 174 and 176 may be each commonly connected at respective ends that are distal to the respective wires 164, 166 and 168. Similarly, the differential mode capacitors 172 may be each commonly connected at respective ends that are distal to the respective wires 164, 166 and 168.

In some embodiments, the common mode capacitors 174 and 176 only need to be rated for a reduced current because common mode current may be very low, due to the high common mode inductance of the exemplary common/differential mode inductors 178.

However, in some embodiments, the DM filtering by the combination of the common/differential mode inductors 178 and the DM capacitors 172 may require damping. This damping may be achieved by interposing e.g., resistors 170 between the DM capacitors 172 and the common/differential mode inductors 178 to reduce inrush when the filter is first energized to reduce ringing in a near resonant frequency of the filter during operation. In some embodiments, the exemplary resistors 170 may each have a resistance in a range of about of about, e.g., 7 Ohm or less, about 5 Ohm or less, 3 Ohm or less or other suitable resistance. In some embodiments, for some applications, the drive filter 140 may be utilized without additional damping.

Additionally, in some embodiments, the filter 140 may permit reducing inductor size by combining the differential mode inductor and a common mode inductor in the common/differential mode inductors 178. The CM inductance J is tuned with common mode capacitors 174 and 176 to create a low pass filter with resonance frequency is the same as the DM filter formed with the DM capacitors 172 and resistors 170. The common/differential mode inductors 178 intermediates between the ASD 150 and the motor 106. The common/differential mode inductors 178 may be of the passive adaptive type. The filter 140, may permit reducing inductor size, while avoiding issues pertaining to winding losses, harmonic currents, etc., associated with reducing the size of the typical L-R-C filter. This greater latitude in reducing the common/differential mode inductors 178 size is due in part to the arrangement of the coils and the connections of the motor lines 158, 160, 162 to tap terminals at the output of the windings of the common/differential mode inductors 178. The common/differential mode inductors 178 are coupled to the ASD 150 at terminals and has a plurality of windings, each of which have a variable inductance attributable to the common/differential mode inductors 178 being of a passive adaptive type.

In some embodiments, the DC bus of the ASD 150 may not be accessible. Thus, the DC+ terminal of CM capacitors 174 and DC− terminals of CM capacitors 176 may be shorted together and connected to the ground 186. Thus, in some embodiments, the ASD 150 may include DC output terminals for connecting to, unlike other drive circuits, thus allowing a user or configuration to connect to the DC bus.

In some embodiments, an integrated DM and CM drive filter 140 can remove more than, e.g., 90% of all high amplitudes of harmonics frequency around switching frequency and sidebands of its integral multiples as shown in FIG. 5-7.

Figure 4C:
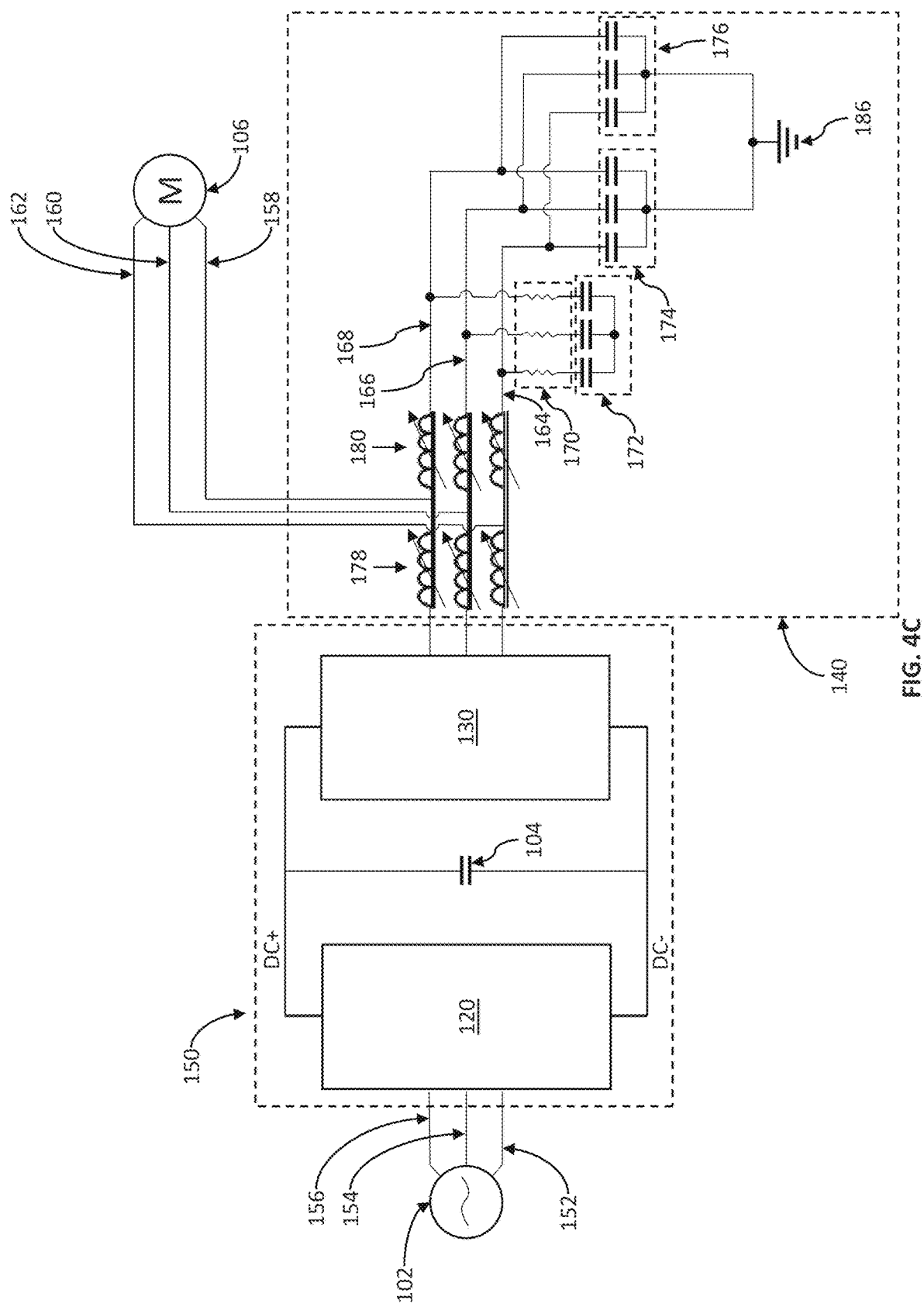

FIG. 4C illustrates another exemplary inventive integrated inverter output passive filter topology in accordance with one or more embodiments of the present invention utilizing common/differential mode inductors 178, output common/differential mode inductors 180, differential mode (DM) capacitors 172 and common mode (CM) capacitors 174 and 176 as the drive filter 140.

In some embodiments of the instant invention the input common/differential mode inductors 178 and output common/differential mode inductors 180 are designed to be utilized for drive output filters that provide a nearly sinusoidal output voltage when driven from variable frequency drives or other types of PWM inverters with switching frequencies at least 2 kilohertz (kHz), such as, e.g., the ASD 150. In some embodiments of the instant invention, the input common/differential mode inductors 178 are coupled to the output common/differential mode inductors 180 to increase inductance. To form a sinewave filter to reduce DM signals, e.g., a DM filter, the common/differential mode inductors 178 and 180 may be tuned with DM capacitors 172 connected to the output common/differential mode inductors 180.

In an embodiment, the common/differential mode inductors 178 and 180 may be common/differential mode three phase inductors. Such inductors have very high common mode inductance as well as differential mode inductance. The high common mode inductance may facilitate a very low common mode current. In an embodiment, a load, such as, e.g., a motor 106 may be connected to the common/differential mode inductors 178 and 180 via the motor lines 158, 160 and 162 interposed between the input common/differential mode inductors 178 and the output common/differential mode inductors 180.

In some embodiments, the exemplary drive filter 140 may permit reducing inductor size by combining the differential mode inductor and the common mode inductor, while avoiding or minimizing winding losses, harmonic currents, waste heat, mechanical vibration, proximity effects, gap heating, skin effect, etc. In an embodiment, the common mode capacitors 174 and 176 may be connected to terminals corresponding to common mode inductance loops of the output common/differential mode inductors 180. Similarly, differential mode capacitors 172 may be connected to terminals corresponding to differential mode inductance loops of the output common/differential mode inductors 180. Thus, each inductor of the output common/differential mode inductors 180 connect to a differential mode capacitor 172 and common mode capacitors 174 and 176 to reduce noise in both differential modes and common modes. In an embodiment, the common mode capacitors 174 and 176 may be each commonly connected at respective ends that are distal to the respective wires 164, 166 and 168. Similarly, the differential mode capacitors 172 may be each commonly connected at respective ends that are distal to the respective wires 164, 166 and 168.

In some embodiments, the common mode capacitors 174 and 176 only need to be rated for a reduced current because common mode current may be very low, due to the high common mode inductance of the exemplary common/differential mode inductors 178 and 180.

However, in some embodiments, the DM filtering by the combination of the common/differential mode inductors 178 and 180 and the DM capacitors 172 may require damping. This damping may be achieved by interposing e.g., resistors 170 between the DM capacitors 172 and the output common/differential mode inductors 180 to reduce inrush when the filter is first energized to reduce ringing in a near resonant frequency of the filter during operation. In some embodiments, the exemplary resistors 170 may each have a resistance in a range of about of about, e.g., 7 Ohm or less, about 5 Ohm or less, 3 Ohm or less or other suitable resistance. In some embodiments, for some applications, the drive filter 140 may be utilized without additional damping.

Additionally, in some embodiments, the filter 140 may permit reducing inductor size by combining the differential mode inductor and a common mode inductor in the input common/differential mode inductors 178 and output common/differential mode inductors 180. The CM inductance J is tuned with common mode capacitors 174 and 176 to create a low pass filter with resonance frequency is the same as the DM filter formed with the DM capacitors 172 and resistors 170. The input common/differential mode inductors 178 and output common/differential mode inductors 180 intermediates between the ASD 150 and the motor 106. The common/differential mode inductors 178 and 180 may be of the passive adaptive type. The filter 140, may permit reducing inductor size, while avoiding issues pertaining to winding losses, harmonic currents, etc., associated with reducing the size of the typical L-R-C filter. This greater latitude in reducing common/differential mode inductors 178 and 180 size is due in part to the arrangement of the coils and the connections of the motor lines 158, 160, 162 to tap terminals intermediate windings of the input common/differential mode inductors 178 and the output common/differential mode inductors 180, respectively. The common/differential mode inductors 178 and 180 is coupled to the ASD 150 at terminals and has a plurality of windings, each of which have a variable inductance attributable to the common/differential mode inductors 178 and 180 being of a passive adaptive type.

In some embodiments, the DC bus of the ASD 150 may not be accessible. Thus, the DC+ terminal of CM capacitors 174 and DC− terminals of CM capacitors 176 may be shorted together and connected to the ground 186. Thus, in some embodiments, the ASD 150 may include DC output terminals for connecting to, unlike other drive circuits, thus allowing a user or configuration to connect to the DC bus.

In some embodiments, an integrated DM and CM drive filter 140 can remove more than, e.g., 90% of all high amplitudes of harmonics frequency around switching frequency and sidebands of its integral multiples as shown in FIG. 5-7.

FIG. 5 illustrates CM voltage at an inverter (e.g., inverter 130) and at a motor (e.g., motor 106) before and after using integrated drive filter 140 of FIGS. 3A-3C and 4A-4C above.

FIG. 6 illustrates the spectrum of CM voltage at an inverter (e.g., inverter 130) after using integrated drive filter 140 of FIGS. 3A-3C and 4A-4C above.

FIG. 7 illustrates the spectrum of CM voltage at a motor (e.g., motor 106) after using integrated drive filter 140 of FIGS. 3A-3C and 4A-4C above.

At least some aspects of the present disclosure will now be described with reference to the following numbered clauses.

1. A drive filter, comprising:
a plurality of input contacts configured for receiving an initial three-phase alternative current from a three-phase alternative current power source;
a plurality of output contacts configured for outputting an output current to a respective phase of an adjustable speed drive, wherein the adjustable speed drive has a direct current bus capacitance between 1 and 30 microfarads (µF); and
a plurality of common/differential mode input inductors;
wherein each common/differential mode inductor of the plurality of common/differential mode input inductors have a common mode inductance and a differential mode inductance;
a plurality of common/differential mode output inductors;
wherein each common/differential mode inductor of the plurality of common/differential mode output inductors have a common mode inductance and a differential mode inductance;
a plurality of differential mode capacitors connected to the plurality of common/differential mode output inductors for filtering differential mode inductances;
wherein the plurality of differential mode capacitors are commonly connected at an end of each differential mode capacitor distal to the common/differential mode inductors;
wherein each differential mode capacitor of the plurality of differential mode capacitors is connected to a respective common/differential mode output inductor of the plurality of common/differential mode output inductors;

a first plurality of common mode capacitors connected to the plurality of common/differential mode output inductors for filtering common mode inductances;
   wherein the first plurality of common mode capacitors are commonly connected at an end of each common mode capacitor distal to the common/differential mode output inductors;
   wherein each common mode capacitor of the first plurality of common mode capacitors is connected to a respective common/differential mode output inductor of the plurality of common/differential mode output inductors;
a second plurality of common mode capacitors connected to the plurality of common/differential mode output inductors for filtering common mode inductances;
   wherein the second plurality of common mode capacitors are commonly connected at an end of each common mode capacitor distal to the common/differential mode output inductors;
   wherein each common mode capacitor of the second plurality of common mode capacitors is connected to a respective common/differential mode output inductor of the plurality of common/differential mode inductors;
a load connected between the plurality of common/differential mode input inductors and the plurality of common/differential mode output inductors.

2. The drive filter as recited in clause 1, wherein:
   the first plurality of common mode capacitors are connected to a DC+ terminal of a direct current bus of the adjustable speed drive; and
   the second plurality of common mode capacitors are connected to a DC− terminal of the direct current bus of the adjustable speed drive.

3. The drive filter as recited in clause 1, wherein the first plurality of common mode capacitors and the second plurality of common mode capacitors are each commonly shorted to a ground.

Publications cited throughout this document are hereby incorporated by reference in their entirety. While one or more embodiments of the present disclosure have been described, it is understood that these embodiments are illustrative only, and not restrictive, and that many modifications may become apparent to those of ordinary skill in the art, including that various embodiments of the inventive methodologies, the inventive systems/platforms, and the inventive devices described herein can be utilized in any combination with each other. Further still, the various steps may be carried out in any desired order (and any desired steps may be added, and/or any desired steps may be eliminated).

The invention claimed is:

1. A drive filter, comprising:
a plurality of filter contacts configured for receiving an initial alternating current from an alternating current (AC) power source;
a plurality of common/differential mode inductors connected to the plurality of filter contacts;
   wherein each common-differential mode inductor of the plurality of common/differential mode inductors have a common mode inductance and a differential mode inductance;
a plurality of differential mode capacitors connected to the plurality of common-differential mode inductors for filtering differential mode inductances;
   wherein the plurality of differential mode capacitors are commonly connected at an end of each differential mode capacitor distal to the plurality of common-differential mode inductors;
   wherein each differential mode capacitor of the plurality of differential mode capacitors is connected to a respective common-differential mode inductor of the plurality of common-differential mode inductors;
a first plurality of common mode capacitors connected to the plurality of common-differential mode inductors for filtering common mode inductances;
   wherein the first plurality of common mode capacitors are commonly connected at an end of each common mode capacitor distal to the plurality of common-differential mode inductors;
   wherein each common mode capacitor of the first plurality of common mode capacitors is connected to the respective common-differential mode inductor of the plurality of common-differential mode inductors;
a second plurality of common mode capacitors connected to the plurality of common-differential mode inductors for filtering common mode inductances;
   wherein the second plurality of common mode capacitors are commonly connected at the end of each common mode capacitor distal to the plurality of common-differential mode inductors;
   wherein each common mode capacitor of the second plurality of common mode capacitors is connected to the respective common-differential mode output inductor of the plurality of common-differential mode inductors; and
a plurality of output contacts connected to the plurality of common-differential mode inductors configured to connect a load to provide a common mode and differential mode filtered alternating current.

2. The drive filter as recited in claim 1, wherein each common-differential mode inductor of the plurality of common-differential mode inductors comprises:
   a common-differential mode input inductor having the common mode inductance and the differential mode inductance;
   a common-differential mode output inductor having the common mode inductance and the differential mode inductance;
   wherein the common-differential mode output inductor is connected in series with the common-differential mode input inductor;
   a tap intermediating between the common-differential mode input inductor and the common-differential mode output inductor; and
   wherein the load is connected to each tap to connect the load to the plurality of common-differential mode inductors.

3. The drive filter as recited in claim 2, wherein:
each differential mode capacitor of the plurality of differential mode capacitors is connected to the common-differential mode output inductor of each common-differential mode inductor;
each common mode capacitor of the first plurality of common mode capacitors is connected to the common-differential mode output inductor of each common-differential mode inductor; and
each common mode capacitor of the second plurality of common mode capacitors is connected to the common-differential mode output inductor of each common-differential mode inductor.

4. The drive filter as recited in claim 1, wherein:
the first plurality of common mode capacitors are connected to a DC+ terminal of a direct current bus of a drive circuit; and
the second plurality of common mode capacitors are connected to a DC− terminal of the direct current bus of the drive circuit.

5. The drive filter as recited in claim 4, wherein DC+ terminal and the DC− terminal are separated by a capacitor.

6. The drive filter as recited in claim 1, wherein the first plurality of common mode capacitors and the second plurality of common mode capacitors are each commonly shorted to a ground.

7. The drive filter as recited in claim 1, wherein the AC power source comprises a three-phase AC power source, and the plurality of common-differential mode inductors comprise three common-differential mode inductors.

8. The drive filter as recited in claim 1, wherein each common-differential mode inductor of the plurality of common-differential mode inductors comprise:
at least one first core segment;
at least one second core segment;
at least one third core segment;
a plurality of common mode gaps;
wherein the plurality of common mode gaps are configured to separate, from each other, the at least one first core segment, the at least one second core segment, and the at least one third core segment;
a plurality of differential mode gaps;
wherein the plurality of differential mode gaps are configured to separate, from each other, the at least one first core segment, the at least one second core segment, and the at least one third core segment.

9. The drive filter as recited in claim 1, further comprising an adjustable speed drive (ASD);
wherein the plurality of common-differential mode inductors are connected between the load and the ASD.

10. The drive filter as recited in claim 1, further comprising a plurality of damping resistors connected between the plurality of differential mode capacitors and the plurality of common-differential mode inductors.

11. A three-phase motor drive circuit, comprising:
a three-phase alternating current (AC) power supply;
an adjustable speed drive (ASD) connected to an output of the three-phase AC power supply;
a drive filter comprising:
a plurality of common-differential mode inductors connected to an output of the ASD;
wherein each common-differential mode inductor of the plurality of common-differential mode inductors has a common mode inductance and a differential mode inductance;
a plurality of differential mode capacitors connected to the plurality of common-differential mode inductors for filtering differential mode inductances;
wherein the plurality of differential mode capacitors are commonly connected at an end of each differential mode capacitor distal to the plurality of common-differential mode inductors;
wherein each differential mode capacitor of the plurality of differential mode capacitors is connected to a respective common-differential mode inductor of the plurality of common-differential mode inductors;
a first plurality of common mode capacitors connected to the plurality of common-differential mode inductors for filtering common mode inductances;
wherein the first plurality of common mode capacitors are commonly connected at an end of each common mode capacitor distal to the plurality of common-differential mode inductors;
wherein each common mode capacitor of the first plurality of common mode capacitors is connected to a respective common-differential mode inductor of the plurality of common-differential mode inductors;
a second plurality of common mode capacitors connected to the plurality of common-differential mode inductors for filtering common mode inductances;
wherein the second plurality of common mode capacitors are commonly connected at an end of each common mode capacitor distal to the plurality of common-differential mode inductors;
wherein each common mode capacitor of the second plurality of common mode capacitors is connected to a respective common-differential mode output inductor of the plurality of common-differential mode inductors; and
a motor connected to the plurality of common-differential mode inductors.

12. The three-phase motor drive circuit as recited in claim 11, wherein each common-differential mode inductor of the plurality of common-differential mode inductors comprises:
a common-differential mode input inductor having a common mode inductance and a differential mode inductance;
a common-differential mode output inductor having a common mode inductance and a differential mode inductance;
wherein the common-differential mode output inductor is connected in series with the common-differential mode input inductor;
a tap intermediating between the common-differential mode input inductor and the common-differential mode output inductor; and
wherein the motor is connected to each tap to connect the load to the plurality of common-differential mode inductors.

13. The three-phase motor drive circuit as recited in claim 12,
each differential mode capacitor of the plurality of differential mode capacitors is connected to the common-differential mode output inductor of each common-differential mode inductor;
each common mode capacitor of the first plurality of common mode capacitors is connected to the common-differential mode output inductor of each common-differential mode inductor; and
each common mode capacitor of the second plurality of common mode capacitors is connected to the common-differential mode output inductor of each common-differential mode inductor.

14. The three-phase motor drive circuit as recited in claim 11, wherein:
the first plurality of common mode capacitors are connected to a DC+ terminal of a direct current bus of the ASD; and
the second plurality of common mode capacitors are connected to a DC− terminal of the direct current bus of the ASD.

15. The three-phase motor drive circuit as recited in claim 14, wherein DC+ terminal and the DC-terminal are separated by a capacitor.

16. The three-phase motor drive circuit as recited in claim 11, wherein the first plurality of common mode capacitors and the second plurality of common mode capacitors are each commonly shorted to a ground.

17. The three-phase motor drive circuit as recited in claim 11, wherein the ASD comprises at least one converter and at least one inverter.

18. The three-phase motor drive circuit as recited in claim 17, wherein inverter comprises an H-bridge.

19. The three-phase motor drive circuit as recited in claim 11, wherein each common-differential mode inductor of the plurality of common-differential mode inductors comprise:
   at least one first core segment;
   at least one second core segment;
   at least one third core segment;
a plurality of common mode gaps;
   wherein the plurality of common mode gaps are configured to separate the at least one first core segment, the at least one second core segment, and the at least one third core segment from each other;
   a plurality of differential mode gaps;
   wherein the plurality of differential mode gaps are configured to separate the at least one first core segment, the at least one second core segment, and the at least one third core segment from each other.

20. The three-phase motor drive circuit as recited in claim 11, further comprising a plurality of damping resistors connected between the plurality of differential mode capacitors and the plurality of common-differential mode inductors.

* * * * *